United States Patent [19]
Kawano et al.

[11] Patent Number: 5,543,347
[45] Date of Patent: Aug. 6, 1996

[54] METHOD OF FORMING SILICON FILM HAVING JAGGED SURFACE

[75] Inventors: Hideo Kawano; Keiji Shiotani; Masao Mikami; Tatsuya Suzuki; Seiichi Shishiguchi, all of Tokyo, Japan

[73] Assignee: NEC Corporation, Tokyo, Japan

[21] Appl. No.: 363,941

[22] Filed: Dec. 27, 1994

[30] Foreign Application Priority Data

Dec. 27, 1993 [JP] Japan ............................. 5-331479
Sep. 20, 1994 [JP] Japan ............................. 6-263032

[51] Int. Cl.$^6$ ..................... H01L 21/70; H01L 27/00
[52] U.S. Cl. .............. 437/60; 437/919; 437/200; 437/977; 148/DIG. 138
[58] Field of Search ................. 437/47–48, 52, 437/60, 919, 200, 977, DIG. 138, 192

[56] References Cited

U.S. PATENT DOCUMENTS 5,110,752  5/1992  Lu ............................................ 437/47
5,182,232  1/1993  Chhabra et al. ...................... 437/200
5,256,587  10/1993 Jun et al. ............................... 437/52

FOREIGN PATENT DOCUMENTS 4-252018  9/1992  Japan.

*Primary Examiner*—Mary Wilczewski
*Assistant Examiner*—H. Jey Tsai
*Attorney, Agent, or Firm*—Sughrue, Mion, Zinn, Macpeak & Seas

[57] ABSTRACT

First, a metal layer is deposited on a silicon film surface to form a silicide layer in an interface between the silicon film and the metal layer. Subsequently, the metal layer is all removed by etching such that silicide islands are left on the surface of the silicon film, and then the exposed silicon film surface is dry-etched by using the silicide islands as a selective mask.

27 Claims, 6 Drawing Sheets

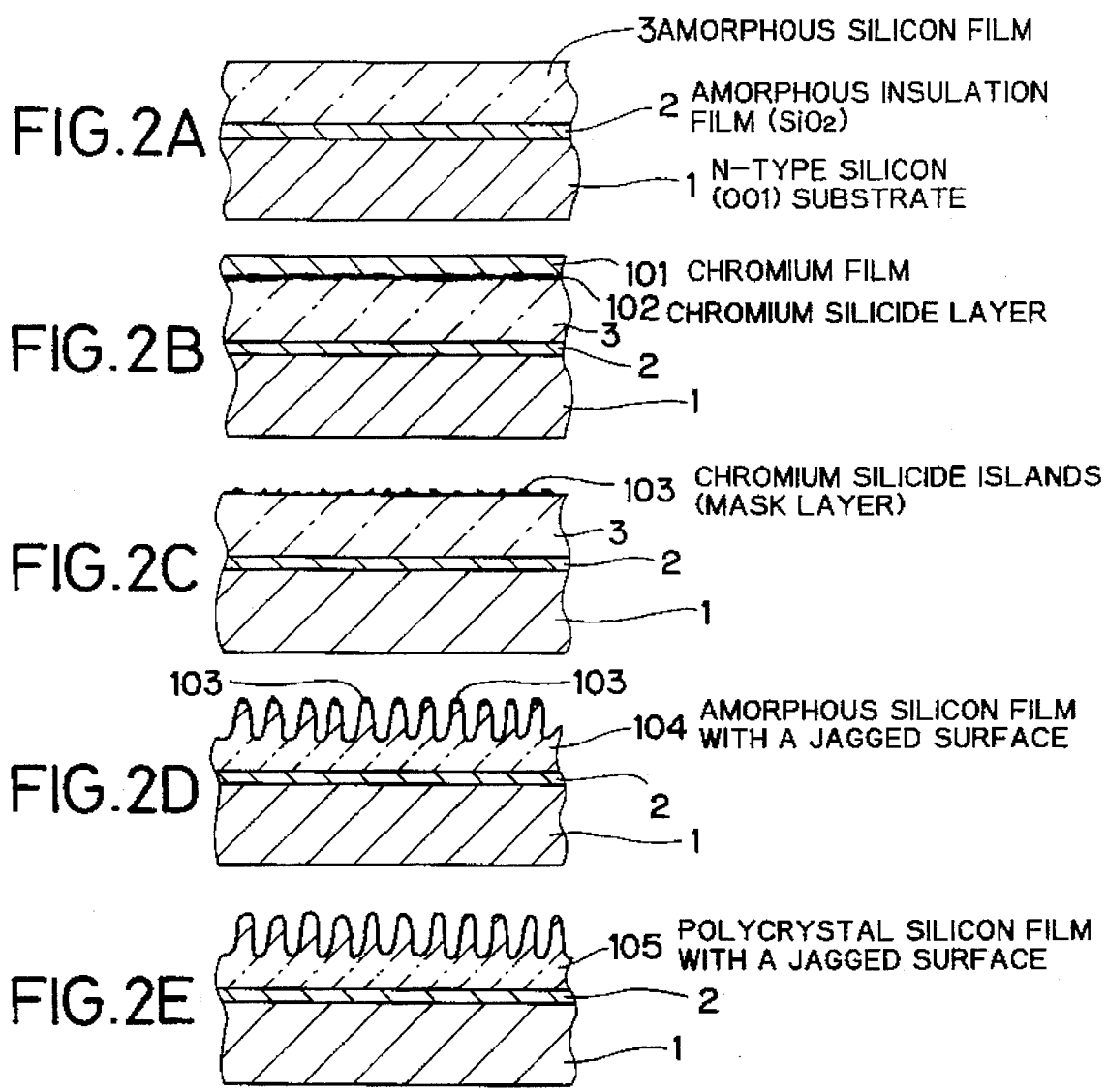

EXAMPLE FOR COMPARISON (EXAMPLE FOR COMPARISON)

METHOD OF FORMING SILICON FILM HAVING JAGGED SURFACE

BACKGROUND OF THE INVENTION

1. Field of the Invention

The present invention relates to a method of forming a silicon film that is used in an electrode of a capacitor as a semiconductor device.

2. Description of the Related Art

In recent years, the size of a memory is reduced with the high integration of Dynamic Random Access Memories. This causes the area of a memory cell capacitor to be reduced, and consequently a problem arises which the capacitance of a memory cell is also reduced. Then, in order to obtain sufficient capacitance, there has been proposed a method of increasing a capacitor area while keeping an insulation film thickness in the status quo.

For example, a method described in Japanese Patent Laid-open Publication No. 4-252018 is shown in FIGS. 1A and 1B. An amorphous insulation film (oxide film) 2 is formed on a substrate 1, and then an amorphous silicon 3 is formed on the insulation film 2. Immediately after formation of the amorphous silicon 3, plasma hydrogen 4 is supplied to the surface of the amorphous silicon 3 without exposing it to the air. The surface atoms of the amorphous silicon 3 are terminated by the hydrogen atoms 5 and become inactive. Therefore, even if it is left in the atmosphere for a long period of time, formation of a natural oxide film would be prevented. Since these hydrogen atoms 5 are dissociated from silicon atoms at a lower temperature than the amorphous silicon layer 3 crystallizes, a clean surface is obtained prior to the crystallization of amorphous silicon. The diffusion speed of the silicon atoms on the clean surface is extremely fast, so that seed grains are formed and grown on the surface of the amorphous silicon 3, and as shown in FIG. 1B there is formed polycrystal silicon 7 having a lot of hemispherical polycrystal grains 6 on its surface, resulting in very large surface area. If the polycrystal silicon 7 formed in this way is used as a capacitor electrode, the capacitance is approximately twice or more as large as in a case where plasma hydrogen 4 is not supplied to the amorphous silicon 3.

However, the conventional method has practical difficulties since the clean surface of the amorphous silicon 3 is unstable and difficult to hold for a long period of time. Moreover, heat treatment under very high vacuum conditions is needed for grain formation and growth. Therefore, the equipment for forming the polycrystal silicon 7 is expensive, and temperature control of the heat treatment is not easy because an allowable range of heat treatment temperature is narrow.

SUMMARY OF THE INVENTION

Accordingly, it is an object of the present invention to provide a method of stably forming a silicon layer having a large surface area with a simpler process.

Another object of the present invention is to provide a method of forming a silicon film having a uniformly jagged surface with easy control.

In a method of forming a silicon film having a jagged surface, a silicon film surface is dotted with silicide islands and is dry-etched using the silicide islands as a selective mask. The silicide islands are formed in the following steps. First, depositing a metal film on the silicon film, a silicide layer is automatically formed in an interface between the metal film and the silicon film. Second, etching and removing this metal film, the silicide islands remains on the silicon film surface with dotting thereon. By performing dry-etching with the silicide islands as a mask, there can be obtained a silicon film having a zigzag or jagged surface. In a case where the silicon film comprises amorphous silicon, polysilicon having a jagged surface can be easily obtained by further performing heat treatment. A metal film for generating a silicide layer is preferable to be heavy metal including chromium, tungsten, and titanium.

In a case where the silicon film comprises silicon containing phosphorus (P), it is preferable that a concentration of P be not greater than $1 \times 10^{20}$ cm$^{-3}$. Particularly, when the concentration of P is not less than $3-10^{20}$ cm$^{-3}$, the jagged shape remarkably becomes ununiform.

According to the present invention, by dry-etching the heavy metal deposited on the silicon film at room temperature, there can be formed a selective mask which comprises silicide islands dotting and uniformly distributed on the silicon film surface. Subsequently, a jagged surface structure can be formed by likewise dry-etching the silicon film surface at room temperature using the selective mask.

Therefore, the process does not need accurate temperature control and becomes simple and is not necessary to keep the clean silicon film surface. This causes the process to improve the reproducibility and to be suitable for large-scale production. Further, the method according to the present invention can be realized with a simple dry-etching apparatus, so it does not need very high vacuum equipment and is superior in production. In addition, since the silicon film surface is dry-etched by using the silicide islands as a selective mask, the difference of altitude on the jagged surface can be easily controlled by the dry-etching. Therefore, large capacitance can be easily achieved.

BRIEF DESCRIPTION OF THE DRAWINGS

The above and other objects and advantages will become apparent from the following detailed description when read in conjunction with the accompanying drawings wherein:

FIGS. 2A through 2E are diagrams showing steps of forming the jagged surface of a polysilicon film according to an embodiment of the present invention;

DESCRIPTION OF THE PREFERRED EMBODIMENTS

Figure 1A:
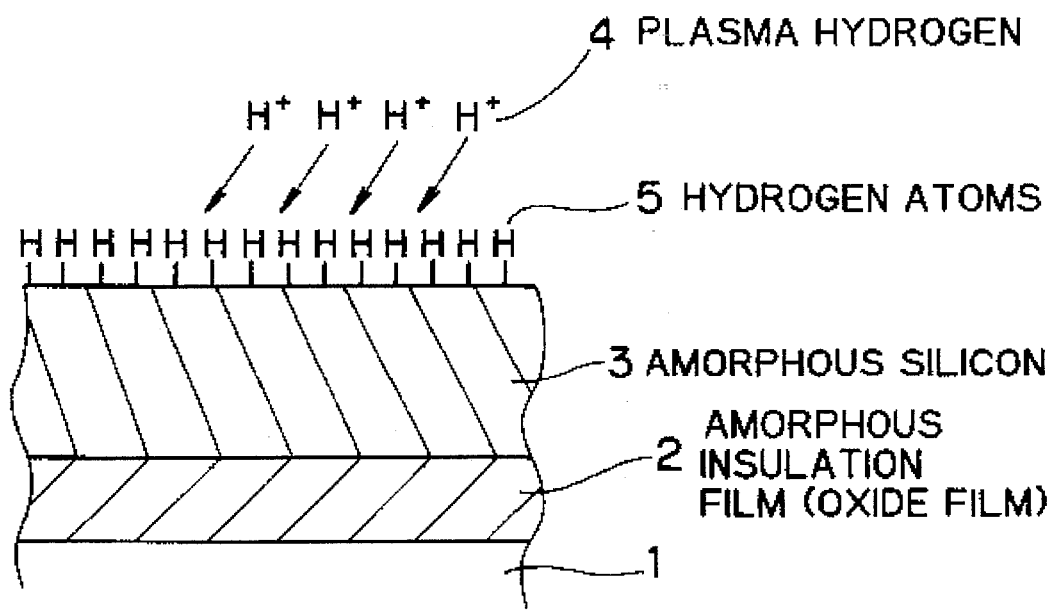
FIGS. 1A and 1B are diagrams showing a conventional method of forming the grained surface of a polysilicon film.
Figure 1B:
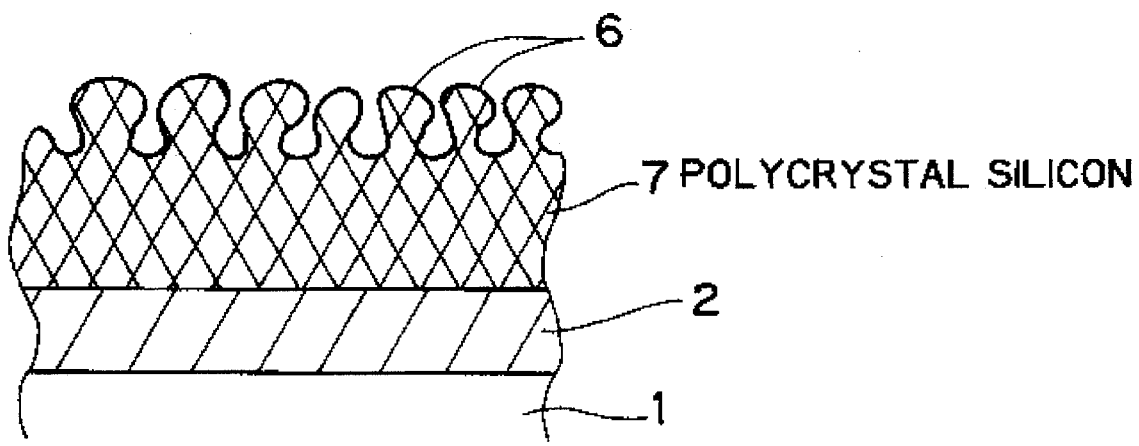

FIGS. 2A–2E illustrate a first embodiment of the present invention. As shown in FIG. 2A, first, an amorphous insulation film (SiO$_2$) 2 of thickness 1000 angstrom ( Å) is formed on an n-type silicon (001) substrate 1 by thermal oxidation, and an amorphous silicon film 3 of thickness 4000 Å is further formed on the amorphous insulation film 2 by a LPCVD (low-pressure chemical vapor deposition) method.

Subsequently, as shown in FIG. 2B, the substrate temperature is set to room temperature, and a chromium (Cr) film 101 of thickness 1500 Å is formed on the amorphous silicon film 3 by a sputtering method. Consequently, a chromium silicide layer 102 of the order of 50 to 100 Å is formed in the interface between the amorphous silicon film 3 and the chromium film 101. According to our observation, the chromium silicide layer 102 is more thickly formed in the side of the amorphous silicon film 3 than in the side of the chromium film 101.

Next, by a dry-etching method using a mixed gas of $Cl_2/O_2/H_2$, the chromium film 101 of thickness 1500 Å is all removed. By this etching removal, as shown in FIG. 2C, the surface of the amorphous silicon film 3 is covered with chromium silicide islands 103 uniformly dotting and the others are exposed.

Figure 3:
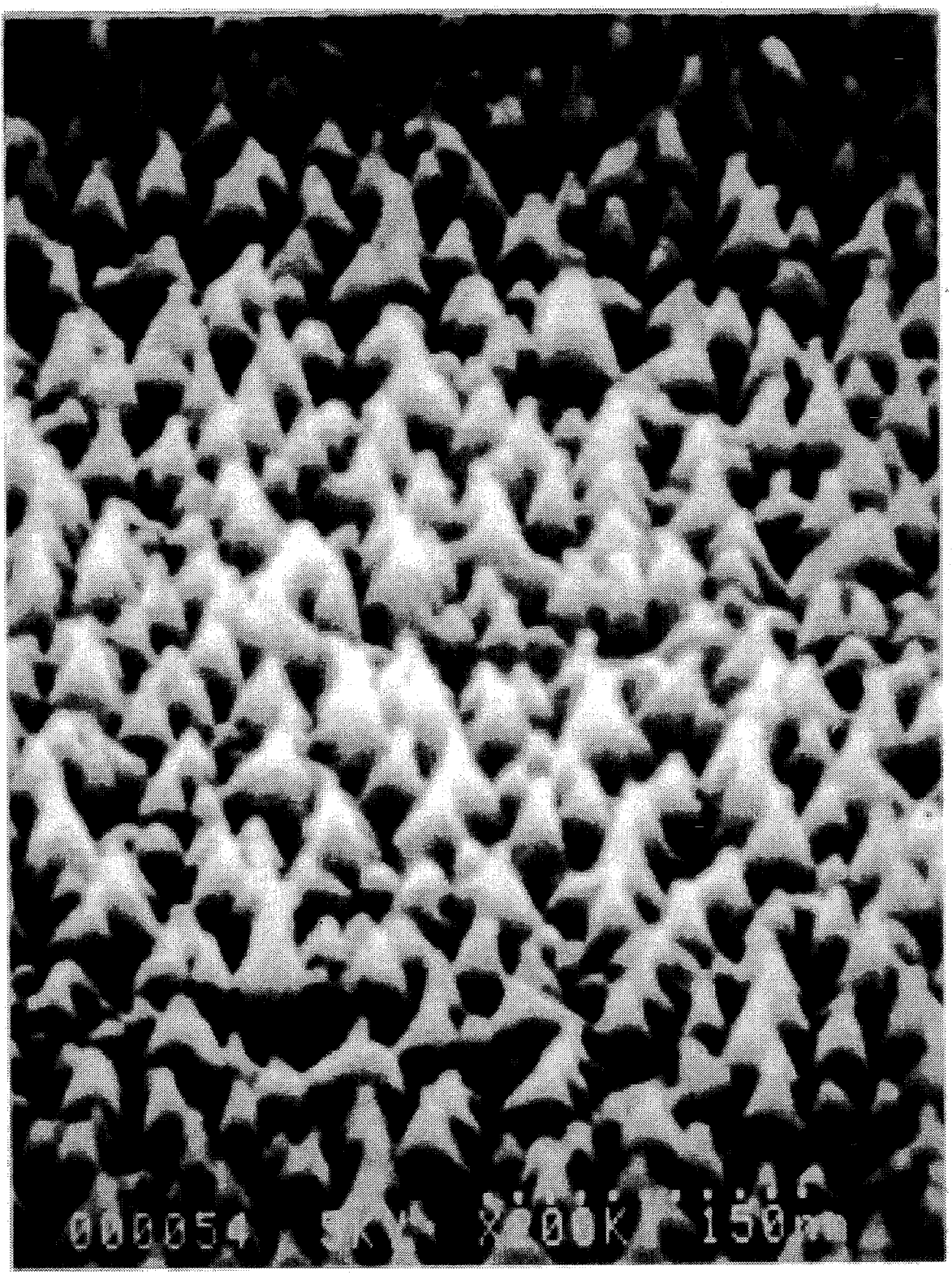
FIG. 3 is a photograph showing an enlarged jagged surface obtained by the embodiment using an electron microscope.
Figure 4A:
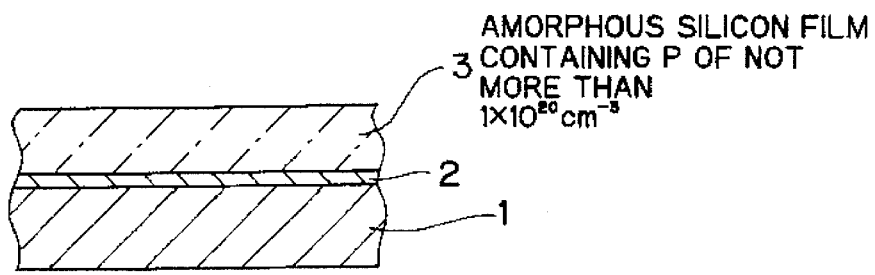
FIGS. 4A through 4E are diagrams showing steps of forming the jagged surface according to another embodiment of the present invention.
Figure 4B:
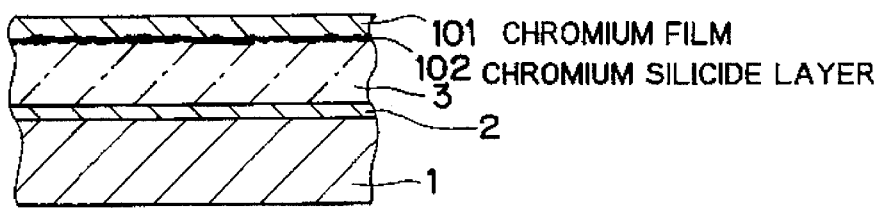
Figure 4C:
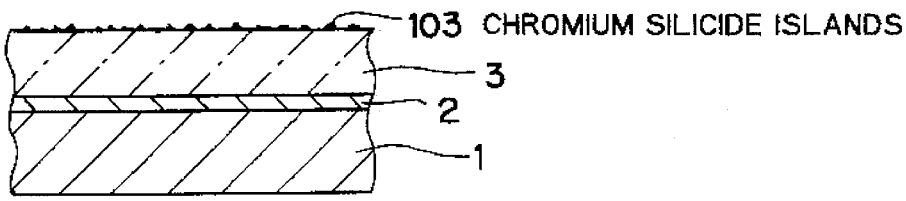
Figure 4D:
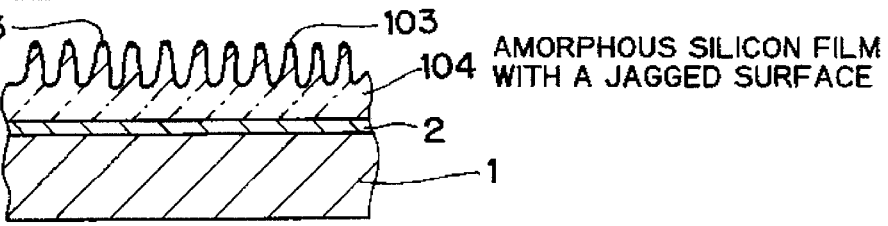
Figure 4E:
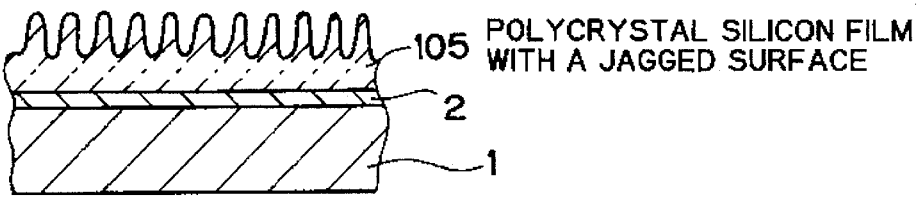

Dry-etching such a surface of the amorphous silicon film 3 by using a mixed gas of $SF_6/O_2/He$, a jagged amorphous silicon film 104 is formed as shown in FIG. 2D. In this embodiment, under the condition that the amorphous silicon film 3 is etched to a depth of 3000 Å, the difference in height on the jagged surface is about 1500 Å. FIG. 3 shows the result that the jagged surface of the amorphous silicon film 104 thus formed was observed with an electron microscope at a magnification of 200 thousand times. It was experimentally found that the chromium silicide islands 103 dotting the amorphous silicon film 3 play the role of a selective mask and only the exposed amorphous silicon is etched and removed so that the jagged surface structure is formed. Note that the difference in height (depth) of the jagged surface can be easily adjusted by the amount of dry etching.

Finally, this jagged amorphous silicon film 104 is polycrystallized by heating it at 650° C. for 5 minutes, and a jagged polysilicon film 105 is obtained as shown in FIG. 2E.

When an oxide film of thickness 100 Å was formed on this jagged polysilicon film 105 to make a capacitor, there is obtained a capacitance which is about 3 times or more as large as in a case where a capacitor is made by the use of the amorphous silicon film 3 having no jagged surface.

Although the chromium film 101 causes the chromium silicide layer 102 to be formed in this embodiment, a similar jagged surface structure can be obtained using high-density heavy metal such as tungsten (W) and titanium (Ti). Also, the same result can be obtained by employing wet etching method for the etching removal of the chromium film 101 instead of dryetching.

FIGS. 4A through 4E show a second embodiment of the present invention. In the embodiment, a concentration of phosphorus (P) in the amorphous silicon film 3 is not greater than $1\times10^{20}$ cm$^{-3}$. In this case, an amorphous silicon film 104 with a jagged surface can be formed by the same procedure as the first embodiment.

Figure 5A:
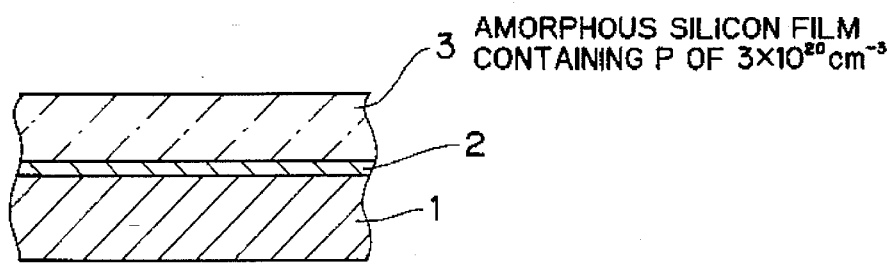
FIGS. 5A through 5D show an example for comparison employing the same steps as the embodiment of FIGS. 4A through 4E provided the amorphous silicon film contains phosphorus greater than $1 \times 10^{20}$ cm$^{-3}$.
Figure 5B:
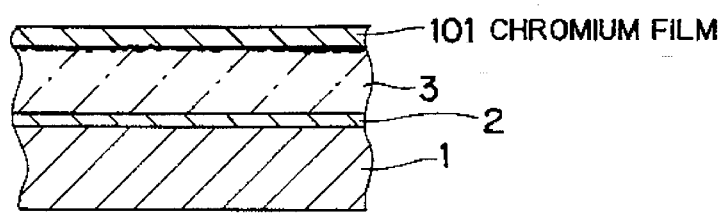
Figure 5C:
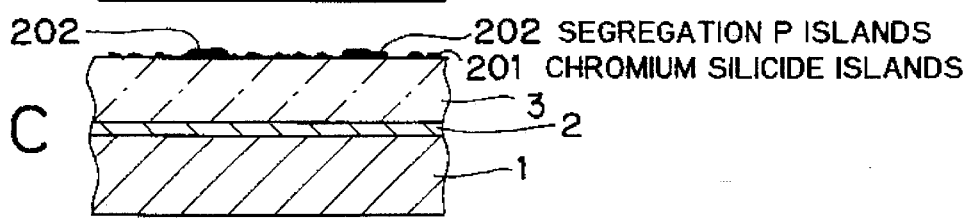
Figure 5D:
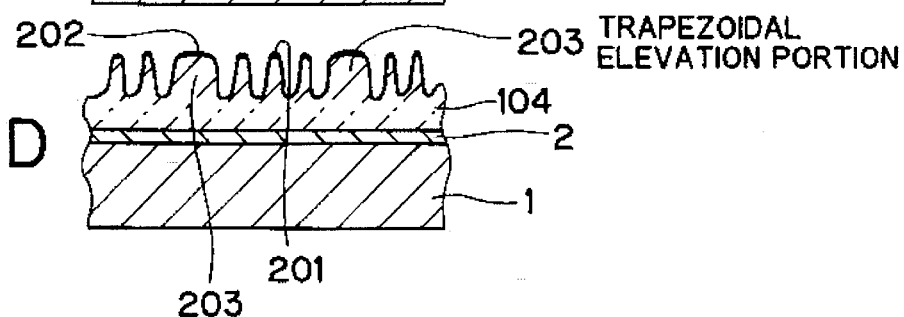

However, as illustrated in FIGS. 5A–5D, if the concentration of P in the amorphous silicon film 3 is, for example, not smaller than $3\times10^{20}$ cm$^{-3}$, the jagged structure of the amorphous silicon film 104 become ununiform, as shown in FIG. 5D. It is conceived that segregation of the phosphorus (P) occurs on the amorphous silicon film 3 to develop into a plurality of larger islands of phosphorus which play the role of a selective mask for dry etching.

Figure 6:
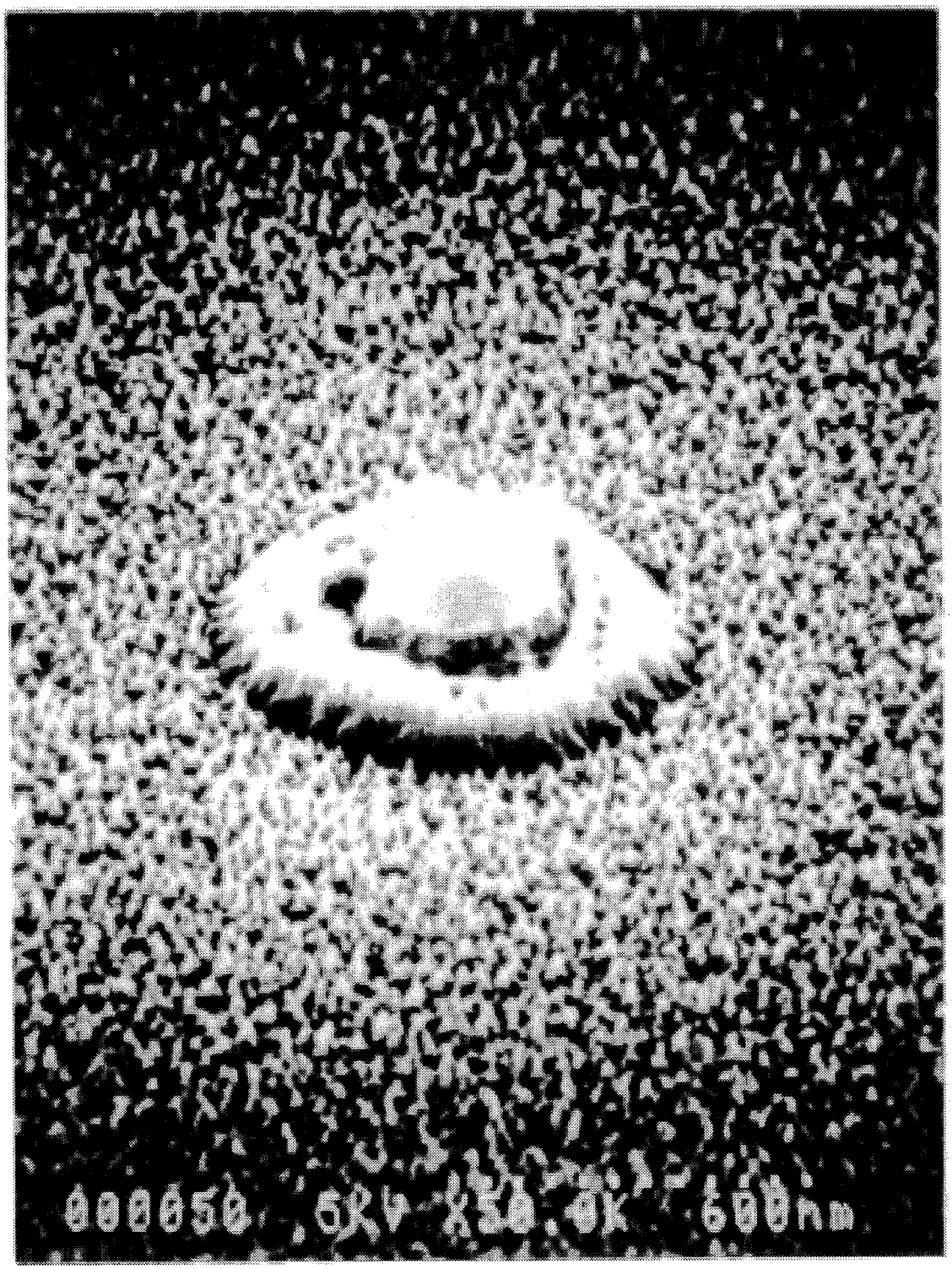
FIG. 6 is a photograph showing an enlarged jagged surface obtained by the example for comparison using an electron microscope.

First, as shown in FIGS. 5A and 5B, an amorphous silicon film 3 containing phosphorus (P) of $3\times10^{30}$ cm$^{-3}$ is formed on an amorphous insulation film 2, and a 1500–Å chromium film 101 is formed on the amorphous silicon film 3. And, a 1500–Å chromium film 101 is removed by dry etching. On the surface of this amorphous silicon film 3, as shown in FIG. 5C, there are segregation phosphorus islands 202 with a large area as well as chromium silicide islands 201. Since these segregation phosphorus islands 202 also play the role of a selective mask for dry etching, trapezoidal elevation portions 203 are formed on the jagged surface, as shown in FIG. 5D. FIG. 6 shows a trapezoidal elevation portion 203 observed with an electron microscope. If there exist such trapezoidal elevation portions in the jagged surface of the polycrystal silicon film, it will become a cause of a fluctuation in capacitance when a capacitor is made.

According to experiments, it is necessary that, in order to obtain an uniformly jagged surface structure, the phosphorus (P) concentration of the amorphous silicon film 3 is not greater than $1\times10^{20}$ cm$^{-3}$.

While in the above-described embodiment the amorphous silicon film 3 has been used, a similar jagged surface can be achieved by using a polysilicon film instead of the amorphous silicon film 3.

Although the subject invention has been described with relation to the preferred embodiments, various modifications and adaptations thereof will now be apparent to those skilled in the art. All such modifications and adaptations as fall within the scope of the appended claims are intended to be covered thereby.

What is claimed is:

1. A method of forming a silicon film having a jagged surface, comprising the steps of:

forming a silicide layer on a silicon film surface;

removing the silicide layer by etching such that a plurality of silicide islands of the silicide layer remains on the silicon film surface; and dry-etching the silicon film surface by using the silicide islands on the silicon film surface as a selective mask.

2. The method as set forth in claim 1, wherein the silicide layer comprises a compound of heavy metal and silicon.

3. The method as set forth in claim 2, wherein the heavy metal comprises chromium (Cr).

4. The method as set forth in claim 2, wherein the heavy metal comprises tungsten (W).

5. The method as set forth in claim 2, wherein the heavy metal comprises titanium (Ti).

6. The method as set forth in claim 1, wherein the silicon film comprises amorphous silicon.

7. The method as set forth in claim 1, wherein the silicon film comprises polysilicon.

8. The method as set forth in claim 1, wherein a concentration of phosphorus of the silicon film is not greater than $1\times10^{20}$ cm$^{-3}$.

9. The method as set forth in claim 1, wherein the silicide layer is formed by depositing a metal layer on the silicon film in an interface between the silicon film and the metal layer.

10. A method of forming a silicon film having a jagged surface, comprising the steps of:

depositing a metal layer on a silicon film surface;

removing all of the metal layer by etching such that a plurality of silicide islands are formed on the silicon film; and dry-etching the silicon film surface from which the metal layer have been removed, using the silicide islands on the silicon surface as a selective mask.

11. The method as set forth in claim 10, wherein the metal layer comprises heavy metal.

12. The method as set forth in claim 11, wherein the heavy metal comprises chromium (Cr).

13. The method as set forth in claim 11, wherein the heavy metal comprises tungsten (W).

14. The method as set forth in claim 11, wherein the heavy metal comprises titanium (Ti).

15. The method as set forth in claim 10, wherein the silicon film comprises amorphous silicon.

16. The method as set forth in claim 10, wherein the silicon film comprises polysilicon.

17. The method as set forth in claim 10, wherein a concentration of phosphorus of the silicon film is not greater than $1 \times 10^{20}$ cm$^{-3}$.

18. A method of forming a silicon film having a jagged surface, comprising the steps of:
    depositing a metal layer on an amorphous silicon film surface;
    removing the metal layer by etching such that a plurality of silicide islands are formed on the silicon film;
    dry-etching the amorphous silicon film surface from which the metal layer has been removed, using the silicide islands on the silicon surface as a selective mask; and
    polycrystallizing the dry-etched amorphous silicon film.

19. The method as set forth in claim 18, wherein the metal layer comprises heavy metal.

20. The method as set forth in claim 19, wherein the heavy metal comprises chromium (Cr).

21. The method as set forth in claim 19, wherein the heavy metal comprises tungsten (W).

22. The method as set forth in claim 19, wherein the heavy metal comprises titanium (Ti).

23. The method as set forth in claim 18, wherein a concentration of phosphorus of the amorphous silicon film is not greater than $1 \times 10^{30}$ cm$^{-3}$.

24. The method as set forth in claim 1, wherein the silicide layer is formed at room temperature automatically when a metal film is deposited on the silicon film surface.

25. The method as set forth in claim 10, wherein a silicide layer is formed at room temperature automatically when the metal film is deposited on the silicon film surface.

26. The method as set forth in claim 18, wherein a silicide layer is formed at room temperature automatically when the metal film is deposited on the silicon film surfaces.

27. The method as set forth in claim 10, wherein said step of removing the metal layer immediately follows said step of depositing a metal layer and said step of dry-etching the silicon film surface immediately follows said step of removing the metal layer.

* * * * *